US00RE41764E

(19) United States
(12) Reissued Patent
Skotnicki et al.

(10) Patent Number: US RE41,764 E
(45) Date of Reissued Patent: Sep. 28, 2010

(54) SEMICONDUCTOR DEVICE WITH COMPENSATED THRESHOLD VOLTAGE AND METHOD FOR MAKING SAME

(76) Inventors: Thomas Skotnicki, 105 Rue de la Ferme, Crolles Montfort (FR), 38920; Romain Gwoziecki, 76 bis rue docteur Hermible, Grenoble (FR), 38000

(21) Appl. No.: 11/318,397

(22) PCT Filed: Jun. 5, 2000

(86) PCT No.: PCT/FR00/01537

§ 371 (c)(1),
(2), (4) Date: May 3, 2002

(87) PCT Pub. No.: WO00/77856

PCT Pub. Date: Dec. 21, 2000

Related U.S. Patent Documents

Reissue of:
(64) Patent No.: 6,667,513
Issued: Dec. 23, 2003
Appl. No.: 10/018,179
Filed: May 3, 2002

(30) Foreign Application Priority Data

Jun. 11, 1999 (FR) ..... 99 07391

(51) Int. Cl.

| | |
|---|---|
| ***H01L 29/76*** | (2006.01) |
| ***H01L 29/94*** | (2006.01) |
| ***H01L 31/062*** | (2006.01) |
| ***H01L 31/113*** | (2006.01) |
| ***H01L 31/119*** | (2006.01) |

(52) U.S. Cl. ..... 257/335; 257/336; 257/344; 257/E29.278; 438/174; 438/194

(58) Field of Classification Search ..... 257/335–338, 257/344, 369, 408, E29.278, E21.632; 438/174, 438/194, 199, 217, 231, 189, 301–303, 305
See application file for complete search history.

(56) References Cited

U.S. PATENT DOCUMENTS

| | | | |
|---|---|---|---|
| 4,154,626 | A | 5/1979 | Joy et al. |
| 4,276,095 | A | 6/1981 | Beilstein, Jr. et al. |

(Continued)

FOREIGN PATENT DOCUMENTS

| | | |
|---|---|---|
| EP | 0 763 855 | 3/1997 |
| JP | 06 318698 | 11/1994 |

OTHER PUBLICATIONS

Hajime Kurata et al: "Self–Aligned Control of Threshold Voltages in Sub–0.2–μm MOSFET's" IEEE Transactions on Electron Devices, vol. 45, No. 10, US, New–York, NY: Oct. 1998, pp. 2161–2166, XP000786856 ISBN: 0018–9383.

(Continued)

*Primary Examiner*—Hoai v Pham

(57) ABSTRACT

A semiconductor device may include a channel region formed between a source and a drain region. One or more first pockets may be formed in the channel region adjacent to junctions. The first pockets may be doped with a dopant of the first conductivity type. At least one second pocket may be formed adjacent to each of the junctions and stacked against each of the first pockets. The second pocket may be doped with a dopant of a second conductivity type such that the dopant concentration in the second pocket is less than the dopant concentration in the first pockets. The second pocket may reduce a local substrate concentration without changing the conductivity type of the channel region.

49 Claims, 2 Drawing Sheets

U.S. PATENT DOCUMENTS

| | | | | | |
|---|---|---|---|---|---|
| 4,636,822 | A | | 1/1987 | Codella et al. | 257/282 |
| 4,683,485 | A | | 7/1987 | Schrantz | |
| 4,801,555 | A | | 1/1989 | Holly et al. | |
| 4,851,360 | A | | 7/1989 | Haken et al. | |
| 4,966,859 | A | | 10/1990 | Risch et al. | |
| 4,968,639 | A | | 11/1990 | Bergonzoni | |
| 4,987,088 | A | | 1/1991 | Bergonzoni et al. | |
| 5,006,477 | A | | 4/1991 | Farb | |
| 5,021,851 | A | | 6/1991 | Haken et al. | |
| 5,045,898 | A | | 9/1991 | Chen et al. | |
| 5,132,753 | A | | 7/1992 | Chang et al. | |
| 5,143,857 | A | | 9/1992 | Finchem et al. | |
| 5,270,235 | A | | 12/1993 | Ito | |
| 5,371,394 | A | | 12/1994 | Ma et al. | |
| 5,409,848 | A | | 4/1995 | Han et al. | |
| 5,422,510 | A | | 6/1995 | Scharf et al. | |
| 5,449,937 | A | | 9/1995 | Arimura et al. | 257/345 |
| 5,548,148 | A | | 8/1996 | Bindal | |
| 5,675,166 | A | | 10/1997 | Ilderem et al. | |
| 5,716,861 | A | | 2/1998 | Moslehi | 438/231 |
| 5,731,611 | A | | 3/1998 | Hshieh et al. | 257/341 |
| 5,759,901 | A | | 6/1998 | Loh et al. | 438/305 |
| 5,767,557 | A | | 6/1998 | Kizilyalli | |
| 5,770,880 | A | | 6/1998 | Woodbury et al. | |
| 5,827,763 | A | | 10/1998 | Gardner et al. | |
| 5,858,827 | A | | 1/1999 | Ono | |
| 5,874,329 | A | | 2/1999 | Neary et al. | |
| 5,949,105 | A | * | 9/1999 | Moslehi | 257/336 |
| 6,017,798 | A | | 1/2000 | Ilderem et al. | |
| 6,020,244 | A | | 2/2000 | Thompson et al. | |
| 6,091,111 | A | | 7/2000 | Demirlioglu et al. | |
| 6,150,200 | A | | 11/2000 | Merchant | |
| 6,172,406 | B1 | | 1/2001 | Nguyen | |
| 6,284,579 | B1 | | 9/2001 | Wang et al. | |
| 6,352,912 | B1 | | 3/2002 | Brown et al. | |
| 6,387,763 | B1 | | 5/2002 | Pio et al. | |
| 6,410,393 | B1 | | 6/2002 | Hao et al. | |
| 6,465,332 | B1 | | 10/2002 | Papadas et al. | |
| 6,486,510 | B2 | | 11/2002 | Brown et al. | |
| 6,507,058 | B1 | | 1/2003 | Hall et al. | |
| 6,559,019 | B1 | | 5/2003 | Nguyen | |
| 6,593,623 | B1 | * | 7/2003 | Sultan | 257/344 |
| 6,667,513 | B1 | | 12/2003 | Skotnicki et al. | |
| 6,700,160 | B1 | | 3/2004 | Merchant | |
| 6,737,715 | B2 | | 5/2004 | Pio et al. | |
| 6,960,499 | B2 | | 11/2005 | Nandakumar et al. | |
| 7,112,501 | B2 | | 9/2006 | Okihara | |
| 2002/0039819 | A1 | | 4/2002 | Guiseppe | |
| 2004/0061187 | A1 | | 4/2004 | Weber | |
| 2004/0132260 | A1 | | 7/2004 | Lenoble | |
| 2005/0151174 | A1 | | 7/2005 | Kim | |

OTHER PUBLICATIONS

Yoshinori Okumura et al.: "Source—to Drain Nonuniformly Doped Channel (NUDC) MOSFET Structures for High Current Drivability and Threshold Controllability" IEEE Transactions on Electron Devices, vol. 39, No. 11, US, New–York, NY: IEEE, Nov. 1992, pp. 2541–2552, XP000321695 ISBN: 0018–9383.

* cited by examiner

SEMICONDUCTOR DEVICE WITH COMPENSATED THRESHOLD VOLTAGE AND METHOD FOR MAKING SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates in general to a semiconductor device, such as an MOS transistor, in which there is compensation for the drop in the threshold voltage ($V_{th}$) due to the short-channel effects, and to a process for fabrication of such a semiconductor device.

2. Description of the Related Art

For a given nominal channel length (L) of a transistor, the threshold voltage ($V_{th}$) drops suddenly, in particular for short-channel transistors (i.e., those having a channel length of less than 0.25 μm and typically a channel length, L, of about 0.18 μm).

The threshold voltage of a semiconductor device such as an MOS transistor, in particular a short-channel device, is a critical parameter of the device. This is because the leakage current of the device (for example, of the transistor) depends strongly on the threshold voltage. Taking into consideration current supply voltages and those envisaged in the future (from 0.9 to 1.8 volts) for such devices and the permitted leakage currents ($I_{off}$ of approximately 1 nA/μm), the threshold voltage $V_{th}$ must have values of approximately 0.2 to 0.25 volts.

The sudden voltage drop (or roll-off) in the zones of the channel region of the semiconductor device results in dispersion of the electrical characteristics of the device and makes it difficult to obtain the desired threshold voltages.

To remedy this threshold voltage roll-off in semiconductor devices such as MOS transistors, it has been proposed, as described in the article "Self-Aligned Control of Threshold Voltages in Sub-0.02-μm MOSFETs" by Hajima Kurata and Toshihiro Sugii, IEEE Transactions on Electron Devices, Vol. 45, No. Oct. 10, 1998, to form, in the channel region, pockets adjacent to the source and drain region junctions that have a conductivity of the same type as the substrate; but in which, the dopant concentration is greater than that of the substrate.

Although this solution reduces the threshold voltage roll-off gradient in the channel region, the short-channel effects lead to a more rapid roll-off of the threshold voltage, $V_{th}$, than the increase in the threshold voltage that can be obtained by incorporating the compensation pockets of the prior art.

Consequently, although these compensation pockets allow partial local compensation for the roll-off of the threshold voltage, $V_{th}$, it is not possible to obtain complete compensation for the roll-off over the entire channel region range desired.

Therefore a semiconductor device, such as an MOS transistor, that remedies the drawbacks of the devices of the prior art may be desired.

More particularly, a semiconductor device, such as an MOS transistor, whose voltage threshold roll-off due to the short-channel effects is almost fully compensated for may be desired. This makes it possible to achieve channel lengths which are arbitrarily small but non-zero.

Also a semiconductor device, such as an MOS transistor, may have a constant threshold voltage, $V_{th}$, when the channel length, L, decreases down to very small effective channel lengths, for example, 0.025 μm or less.

A process for fabricating a semiconductor device may apply to devices having channels of arbitrarily small length, these being, moreover, technologically realizable.

DESCRIPTION OF THE INVENTION

A semiconductor device is described that may have a semiconductor substrate with a predetermined concentration, Ns, of a dopant of a first conductivity type. The device may have source and drain regions which are doped with a dopant of a second conductivity type, which is opposite of the first conductivity type. Junctions delimiting a channel region of predetermined nominal length, $L_N$, may be defined in the substrate. A first pocket adjacent to each of the junctions and having a predetermined length, Lp, may be defined. The first pockets may be doped with a dopant of the first conductivity type but with a local concentration, Np, which locally increases the net concentration in the substrate. The device may include at least one second pocket located adjacent to each of the junctions and stacked against each of the first pockets. These second pockets may have a length, Ln, such that Ln>Lp. The second pockets may be doped with a dopant of the second conductivity type and have a concentration, Nn, such that Nn<Np. This may locally decrease the net concentration of the substrate without changing the conductivity type.

In an embodiment, the second pockets include a plurality of elementary pockets stacked against one another. Each elementary pocket of a given rank, i, may have a predetermined length, $Ln_i$, and a predetermined concentration, $Nn_i$, of a dopant of the second conductivity type satisfying the following relationships:

$Ln_1>Lp$, $Ln_{i-1}<Ln_i<Ln_{i+1}$, $Nn_{i-1}>Nn_i>Nn_{i+1}$, and the sum, $\Sigma Nn_i$, of the concentrations of the dopant of the second conductivity type in the elementary pockets may be such that:

$\Sigma Nn_i<Ns$.

In other words, the second pockets decrease the net concentration of dopant of the first conductivity type both in the first pockets and in the channel region. However, they do not change the conductivity type of the first pockets nor of the channel region.

A process for fabricating a semiconductor device as defined above is described. The process may include the formation of a source region and of a drain region in a semiconductor substrate having a predetermined concentration, Ns, of a dopant of a first conductivity type. The source region and the drain region may be doped with a dopant of a second conductivity type, which is opposite of the first conductivity type. The source and drain regions may form one or more junctions in the substrate such that the junctions delimit between them a channel region. The channel region may have a predetermined nominal length, $L_N$. In the channel region in a zone adjacent to each of the junctions, one or more first pockets may be formed having a predetermined length, Lp, and a predetermined concentration, Np. This may locally increase the net concentration in the substrate above Ns. The process may furthermore include the implantation, in the channel region, of a dopant of the second conductivity type, which is opposite of the first conductivity type. This may be done under a set of conditions such that at least one second pocket is formed in the channel region. Each second pocket may be stacked against each of the first pockets, respectively. The second pocket may have a length, Ln, such that Ln>Lp, and a concentration, Nn, of a dopant of the first type such that Nn<Np. This may locally decrease the net concentration in the substrate, without changing the conductivity type.

In a preferred embodiment, the implantation of the dopant of the second conductivity type consists of a series of successive implantations under a set of conditions such that the second pockets formed each consist of a plurality of elementary pockets stacked against one another. Each elementary pocket of a given rank, i, may have a length, $Ln_i$, and a concentration, $Nn_i$, of a dopant of the second conductivity type satisfying the relationships:

$Ln_1>Lp$, $Ln_{i-1}<Ln_i<Ln_{i+1}$, $Nn_{i-1}>Nn_i>Nn_{i+1}$, and the [sun] *sum*, $\Sigma Nn_i$, of the concentrations of the dopant of the second conductivity type in the elementary pockets being such that:

$\Sigma Nn_i<Ns$.

The lengths Lp and Ln of the pockets are taken from the junctions.

Implantation of a dopant in a semiconductor substrate is a known process and it is possible, in the present process, to use any implantation process conventionally used in the technology of semiconductors.

As is known, the formation of doped pockets in a semiconductor substrate depends on the angle of incidence of the implantation with respect to the normal to the substrate, on the implantation dose, and on the implantation energy of the dopant. Thus, by varying the angle of incidence and the dopant dose, it is possible to increase the length of the implanted pocket and to vary the dopant concentration.

As a variant, in order to vary the length of the second implanted pockets and their dopant concentration, successive implantation steps may be carried out with the same angle of incidence with respect to the normal, the same dose, and the same implantation energy. However, subjecting the device to a different annealing heat treatment step after each successive implantation step may make the dopant implanted in the substrate diffuse differently for each implanted pocket.

BRIEF DESCRIPTION OF THE DRAWINGS

The remainder of the description refers to the appended figures, which show respectively.

DETAILED DESCRIPTION OF THE DRAWINGS

Figure 1:
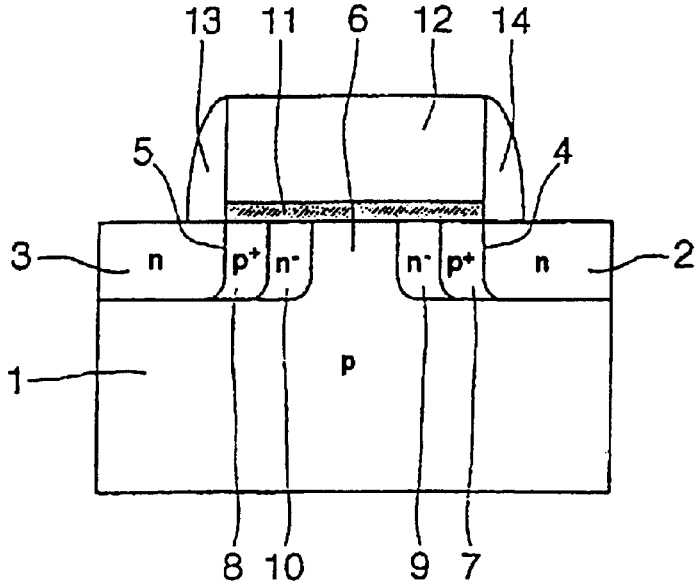
FIG. 1, a first embodiment of a semiconductor device, such as an MOS transistor.

FIG. 1 shows a first embodiment of a semiconductor device, such as an MOS transistor. The semiconductor device may include a semiconductor substrate 1, which may be, for example, a silicon substrate doped with a dopant of a first conductivity type (for example, p-type conductivity). Source 2 and drain 3 regions may be formed in the substrate 1 and doped with a dopant of a second conductivity type, which is opposite of the first conductivity type (for example, an n-type dopant). The source and drain regions may, in the substrate, define junctions 4, 5 delimiting between them a channel region 6.

The channel region 6 may be covered with a gate oxide layer 11 (for example, a thin silicon oxide layer), which is itself surmounted by a gate 12 (for example, a gate made of silicon). The gate 12 may be flanked on two opposed sides by spacers 13, 14 made of a suitable dielectric.

To reduce the rate of roll-off of the threshold voltage, $V_{th}$, in the channel region 6, two first pockets 7, 8 are formed in the channel region. Each pocket may be adjacent to one of the junctions 4, 5, respectively. These pockets are doped by means of a dopant of the first conductivity type, p, but with a concentration, Np, of dopant which locally increases the concentration in the substrate to above Ns and has a length, Lp, as short as possible.

Two second pockets 9, 10 are formed in the channel region 6. The second pockets are each stacked against one of the first pockets, but with a length, Ln, greater than the length, Lp, of the first pockets. The second pockets are doped with a dopant of the second conductivity type. For example, the dopant may be an n-type dopant with a concentration, Nn, such that Nn is less than the concentration Np of dopant of the first conductivity type in the substrate.

Thus, in the zones of the second pockets, the net concentration of dopant of the first conductivity type (for example, the p-type dopant) is decreased but the nature of the conductivity in the channel region is not changed. The channel may still remain a region of p-type conductivity.

Figure 2:
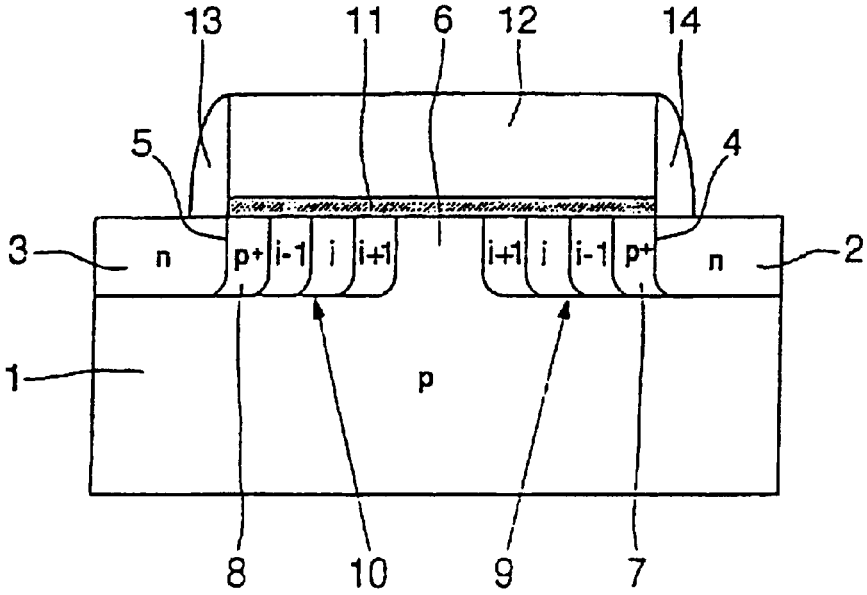
FIG. 2, a second embodiment of a semiconductor device.

FIG. 2, in which the same reference numbers denote the same elements as previously, shows another embodiment of a semiconductor device. FIG. 2 shows that the second pockets 9, 10 may include pluralities of elementary pockets stacked against one another. For example, pluralities of elementary pockets may include three elementary pockets as shown in the embodiment of FIG. 2.

Each elementary pocket of a given rank, i, has a length, $Ln_i$, and a concentration, Nni, of dopant of the second conductivity type which satisfy the following relationships:

$Lp<Ln_i$, $Ln_{i-1}<Ln_i<Ln_{i+1}$, $Nn_{i-1}<Nn_i<Nn_{i+1}$, and the sum $\Sigma Nn_i$ of the concentrations of the dopant of the second conductivity type in the elementary pockets being such that:

$\Sigma Nn_i<Ns$.

In other words, the elementary pockets stacked against the first pockets 7 and 8 are also stacked against one another. However, they have increasing lengths and, concurrently, concentrations of dopant of the first conductivity type which decrease as their lengths increase.

Moreover, the sum of the concentrations, $\Sigma Nn_i$, of the stacked elementary pockets is such that it remains less than the concentration, Ns, of dopant of the first conductivity type in the substrate so that the conductivity type of the channel region 6 is not modified.

Thus, in the case shown in FIG. 2, in which the second pockets consist of three elementary pockets. The lengths and dopant concentrations of the elementary pockets satisfy the relationships:

$Lp<Ln_1$, $Ln_1<Ln_2<Ln_3$, $Nn_1>Nn_2>Nn_3$, and $Nn_1+Nn_2+Nn_3<Ns$.

Figure 3:
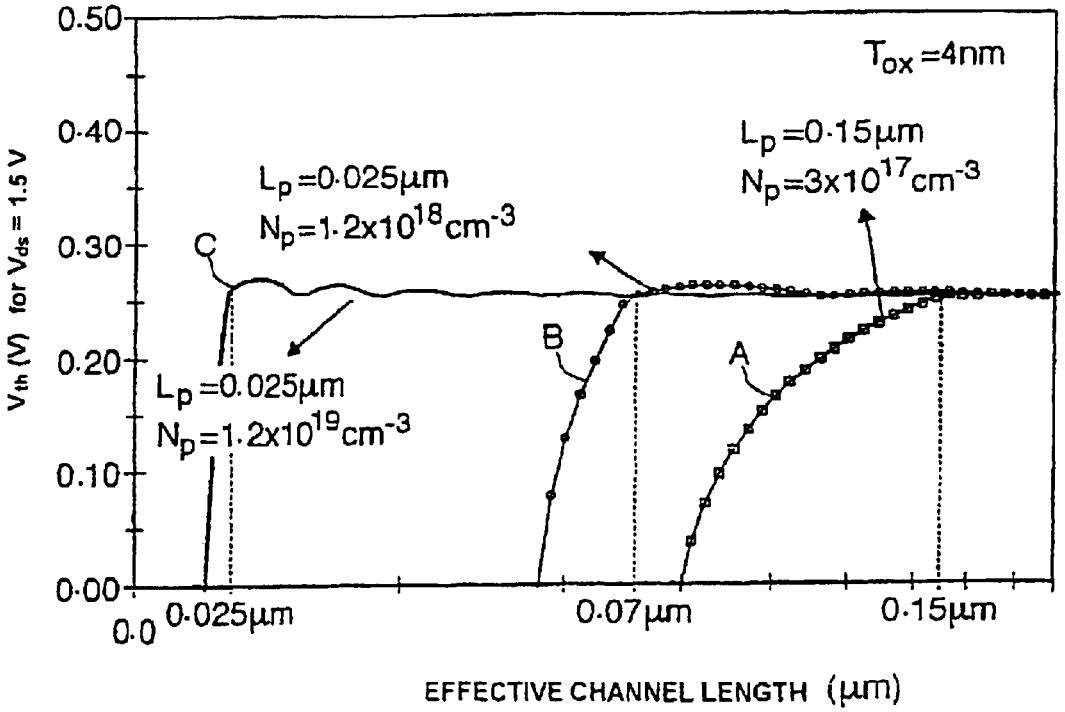
FIG. 3, a graph of the threshold voltage ($V_{th}$) for various semiconductor devices as a function of the effective channel length.

FIG. 3 shows simulated graphs of the threshold voltage, $V_{th}$, for transistors having a gate oxide layer 4 nm in thickness and for a drain/source voltage of 1.5 volts as a function of the effective channel length. The lengths, Lp, and the concentrations, Np, of the first pockets doped with a dopant of the same type as the substrate correspond to the minimum channel length to be obtained and the highest doping.

Curve A corresponds to the stacking of a single second pocket and shows that a flat $V_{th}$ is obtained for a channel length down to 0.15 μm.

Curve B corresponds to the stacking of two second pockets and shows that a flat $V_{th}$ is obtained for a channel length down to 0.07 μm.

Finally, curve C corresponds to the stacking of seven second pockets and shows that a flat $V_{th}$ can be obtained for a channel length down to 0.025 μm.

Thus, the above curves show that the necessary doping levels remain reasonable and make it possible to obtain flat curves of $V_{th}$ as a function of the effective channel length down to effective lengths of 25 nm. This may be so even with gate oxide thicknesses of 4 nm.

What is claimed is:

1. A semiconductor device, comprising:

a semiconductor substrate having a predetermined concentration, Ns, of a dopant of a first conductivity type;

a source region and a drain region doped with a dopant of a second conductivity type;

junctions, wherein the junctions delimit a channel region of a predetermined length, $L_N$, in the substrate, wherein the junctions are defined by the source region and the drain region;

first pockets located adjacent to each of the junctions, wherein the pockets have a predetermined length, Lp, wherein the first pockets are doped with a dopant of the first conductivity type with a dopant concentration, Np, which locally increases a net concentration in the substrate above Ns;

second pockets located adjacent to each of the junctions and stacked against each of the first pockets, wherein the second pockets have a length, Ln, such that Ln is greater than Lp, and wherein the second pockets are doped with a dopant of the second conductivity type with a dopant concentration, Nn, such that Nn is less than Np, which locally decreases a net concentration without changing a conductivity type, and wherein Nn is less than Ns; and wherein an overall length of the first pockets and the second pockets is less than the length, $L_N$, of the channel region.

2. The semiconductor device of claim 1, wherein the second pockets comprise a plurality of elementary pockets stacked against each other.

3. The semiconductor device of claim 1, wherein the second pockets comprise a plurality of elementary pockets stacked against each other, wherein each elementary pocket comprises a rank, i, and a predetermined length, $Ln_i$, wherein a predetermined concentration, $Nn_i$, of a dopant of the second conductivity type satisfies the relationships:

$Ln_1>Lp$;

$Ln_{i-1}<Ln_i<Ln_{i+1}$;

$Nn_{i-1}>Nn_i>Nn_{i+1}$; and wherein the sum, $\Sigma Nn_i$, of the concentrations of the dopant in the elementary pockets satisfies the relationship, $\Sigma Nn_i<Ns$.

4. The semiconductor device of claim 1, wherein the second pockets comprise a plurality of elementary pockets stacked against each other, and wherein the plurality of elementary pockets comprises three elementary pockets.

5. The semiconductor device of claim 1, wherein the semiconductor device comprises an MOS transistor.

6. The semiconductor device of claim 1, wherein the first conductivity type comprises p-type conductivity.

7. The semiconductor device of claim 1, wherein the second conductivity type comprises n-type conductivity.

8. A method for fabricating a semiconductor device, comprising:

forming a semiconductor substrate with a predetermined concentration, Ns, of a dopant of a first conductivity type;

forming a source region and a drain region by doping the source and drain regions with a dopant of a second conductivity type, wherein the second conductivity type is opposite the first conductivity type, wherein the source and drain regions form junctions that delimit a channel region between them, and wherein the channel region comprises a predetermined length, $L_N$;

forming first pockets adjacent to each of the junctions in the channel region, wherein the first pockets are formed by doping each of the first pockets with a predetermined concentration, Np, of a dopant of the first conductivity type, which locally increases a net concentration in the substrate above Ns, and wherein each of the first pockets comprises a predetermined length, Lp; and implanting in the channel region a dopant of the second conductivity type under a set of conditions such that second pockets are formed in the channel region, wherein the second pockets are stacked against each of the first pockets, wherein the second pockets have a length, Ln, such that Ln is greater than Lp, wherein the second pockets have a concentration, Nn, of the dopant of the second conductivity type such that Nn is less than Np, which locally decreases a net concentration without changing a conductivity type, wherein Nn is less than Ns, and wherein the overall length of the first pockets and the second pockets is less than the nominal length, $L_N$, of the channel region.

9. The method of claim 8, wherein implanting in the channel region comprises a series of successive implanting steps such that the second pockets comprise a plurality of elementary pockets.

10. The method of claim 8, wherein implanting in the channel region comprises a series of successive [implantion] *implantation* steps such that the second pockets [comprise] *comprises* a plurality of elementary pockets, wherein each elementary pocket comprises a rank, i, and a predetermined length, $Ln_i$, and wherein a predetermined concentration, $Nn_i$, of a dopant of the second conductivity type satisfies the relationships:

$Ln_1>Lp$;

$Ln_{i-1}<Ln_i<Ln_{i+1}$;

$Nn_{i-1}>Nn_i>Nn_{i+1}$; and wherein the sum, $\Sigma Nn_i$ of the concentrations of the dopant in the elementary pockets satisfies the relationship, $\Sigma Nn_i<Ns$.

11. The method of claim 10, further comprising increasing an implantation angle of incidence with respect to the normal angle to the substrate with each successive [implantion] *implantation* step and decreasing an implantation dose with each successive [implantion] *implantation* step.

12. The method of claim 10, wherein the successive implanting steps comprise implanting the dopant of the second conductivity type using a same angle of incidence with respect to the normal angle to the substrate, a same implantation dose, and a same implantation energy in each successive [implantion] *implantation* step, the method further comprising annealing the device in an annealing step after each successive [implantion] *implantation* step, wherein each annealing step is different.

13. The method of claim 8, wherein the set of conditions comprises an implantation angle of incidence with respect to the normal angle to the substrate, an implantation dose, and an implantation energy.

14. The method of claim 8, wherein the set of conditions comprises an implantation angle of incidence with respect to the normal angle to the substrate.

15. The method of claim 8, wherein the set of conditions comprises an implantation dose.

16. The method of claim 8, wherein the set of conditions comprises an implantation energy.

17. The method of claim 8, further comprising forming an MOS transistor with the semiconductor device.

18. The method of claim 8, wherein the first conductivity type comprises p-type conductivity.

19. The method of claim 8, wherein the second conductivity type comprises n-type conductivity.

20. A semiconductor device, comprising:

a semiconductor substrate having a concentration, Ns, of a dopant of a first conductivity type;

a source region and a drain region doped with a dopant of a second conductivity type;

junctions that define a channel region of a length, $L_N$, in the substrate, wherein the junctions are defined by the source region and the drain region;

first pockets located adjacent to each of the junctions, wherein the first pockets have a length, Lp, and wherein the first pockets are doped with a dopant of the first conductivity type with a dopant concentration, Np;

second pockets stacked against each of the first pockets, wherein the second pockets have a length, Ln, such that Ln is greater than Lp, wherein the second pockets are doped with a dopant of the second conductivity type with a dopant concentration, Nn, such that Nn is less than Np; and wherein an overall length of the first pockets and the second pockets is less than the length, $L_N$, of the channel region.

*21. A semiconductor device, comprising:*

*a semiconductor substrate having a concentration, Ns, of a dopant of a first conductivity type;*

*a source region and a drain region doped with a dopant of a second conductivity type;*

*junctions that define a channel region of a length, $L_N$, in the substrate, wherein the junctions are defined by the source region and the drain region;*

*first pockets including a pocket located adjacent to each of the junctions, wherein each of the first pockets is doped with a dopant of the first conductivity type with a dopant concentration, Np;*

*second pockets including one pocket stacked against each of the first pockets, wherein each of the second pockets is doped with a dopant of the second conductivity type with a dopant concentration, Nn; and*

*wherein an overall length of the first pockets and the second pockets is less than the length, $L_N$, of the channel region.*

*22. The semiconductor device of claim 21, wherein the first pockets each have a length, Lp, and the second pockets each have a length, Ln, and wherein Ln is greater than Lp.*

*23. The semiconductor device of claim 21, wherein Nn is less than Np.*

*24. The semiconductor device of claim 21, wherein each of the second pockets comprise a plurality of elementary pockets stacked against each other.*

*25. The semiconductor device of claim 21, wherein each of the second pockets comprises a plurality of elementary pockets stacked against each other, wherein each elementary pocket in one of the second pockets has a rank, i, a length, $Ln_i$, and a concentration, $Nn_i$, of a dopant of the second conductivity type satisfying the relationships:*

$Ln_1 > Lp$;

$Ln_{i-1} < Ln_i < Ln_{i+1}$;

$Nn_{i-1} > Nn_i > Nn_{i+1}$; *and*

*wherein the sum, $\Sigma Nn_i$, of the concentrations of the dopant in the elementary pockets in one of the second pockets satisfies the relationship, $\Sigma Nn_i < Ns$.*

*26. The semiconductor device of claim 21, wherein each of the second pockets comprises a plurality of elementary pockets stacked against each other, and wherein the plurality of elementary pockets comprises three elementary pockets.*

*27. The semiconductor device of claim 21, wherein the semiconductor device comprises an MOS transistor.*

*28. The semiconductor device of claim 21, wherein the first conductivity type is p-type conductivity.*

*29. The semiconductor device of claim 21, wherein the second conductivity type is n-type conductivity.*

*30. A method for fabricating a semiconductor device, comprising:*

*forming a semiconductor substrate with a concentration, Ns, of a dopant of a first conductivity type;*

*forming a source region and a drain region by doping the source and drain regions with a dopant of a second conductivity type, wherein the second conductivity type is opposite the first conductivity type, wherein the source and drain regions form junctions that delimit a channel region between them, and wherein the channel region comprises a length, $L_N$;*

*forming first pockets including a pocket adjacent to each of the junctions in the channel region, wherein each of the first pockets is formed by doping each of the first pockets with a concentration, Np, of a dopant of the first conductivity type; and*

*implanting in the channel region a dopant of the second conductivity type under a set of conditions such that second pockets are formed in the channel region, wherein the second pockets include a pocket stacked against each of the first pockets, wherein the second pockets have a concentration, Nn, of the dopant of the second conductivity type, and wherein the overall length of the first pockets and the second pockets is less than the length, $L_N$, of the channel region.*

*31. The method of claim 30, wherein forming the first pockets with the concentration, Np, locally increases a net concentration in the substrate above Ns.*

*32. The method of claim 30, wherein each of the first pockets has a length, Lp, and each of the second pockets have a length, Ln, and wherein Ln is greater than Lp.*

*33. The method of claim 30, wherein Nn is less than Np which locally decreases a net concentration without changing a conductivity type.*

*34. The method of claim 30, wherein Nn is less than Ns.*

*35. The method of claim 30, wherein implanting in the channel region comprises a series of successive implanting steps such that each of the second pockets comprises a plurality of elementary pockets.*

36. The method of claim 30, wherein implanting in the channel region comprises a series of successive implantation steps such that each of the second pockets comprises a plurality of elementary pockets, wherein each elementary pocket has a rank, i, a length, $Ln_i$, and a concentration, $Nn_i$, of a dopant of the second conductivity type satisfying the relationships:

$Ln_1>Lp$;

$Ln_{i-1}<Ln_i<Ln_{i+1}$;

$Nn_{i-1}>Nn_i>Nn_{i+1}$; and wherein the sum, $\Sigma Nn_i$, of the concentrations of the dopant in the elementary pockets in each of the second pockets satisfies the relationship, $\Sigma Nn_i<Ns$.

37. The method of claim 36, further comprising increasing an implantation angle of incidence with respect to the normal angle to the substrate with each successive implantation step and decreasing an implantation dose with each successive implantation step.

38. The method of claim 36, wherein the successive implanting steps comprise implanting the dopant of the second conductivity type using a same angle of incidence with respect to the normal angle to the substrate, a same implantation dose, and a same implantation energy in each successive implantation step, the method further comprising annealing the device in an annealing step after each successive implantation step, wherein each annealing step is different.

39. The method of claim 30, wherein the set of conditions comprises an implantation angle of incidence with respect to the normal angle to the substrate.

40. The method of claim 30, wherein the set of conditions relates to an implantation dose.

41. The method of claim 30, wherein the set of conditions relates to an implantation energy.

42. The method of claim 30, further comprising forming a MOS transistor with the semiconductor device.

43. The method of claim 30, wherein the first conductivity type is p-type conductivity.

44. The method of claim 43, wherein the second conductivity type is n-type conductivity.

45. A semiconductor device, comprising:

a semiconductor substrate having a concentration, Ns, of a dopant of a first conductivity type;

a source region and a drain region doped with a dopant of a second conductivity type;

first and second junctions that define a channel region of a length, $L_N$, in the substrate, wherein the first and seocnd junctions are defined by the source region and the drain region, respectively;

a first set of pockets that includes a first pocket and a second pocket, wherein the first and second pockets are located adjacent to the first and second junctions, respectively, and wherein each of the first set of pockets is doped with a dopant of the first conductivity type with a dopant concentration, Np;

a second set of pockets that includes at least one pocket in the channel region adjacent to the first pocket, and at least one pocket in the channel region adjacent to the second pocket, wherein each of the second set of pockets is doped with a dopant of the second conductivity type with a dopant concentration, Nn; and wherein an overall length of the first set of pockets and the second set of pockets is less than the length, $L_N$, of the channel region.

46. The semiconductor device of claim 45, wherein each of the first set of pockets has a length, Lp, and each of the second set of pockets has a length, Ln, and wherein Ln is greater than Lp.

47. The semiconductor device of claim 45, wherein Nn is less than Np.

48. The semiconductor device of claim 45, wherein the second set of pockets includes:

a first group of at least two pockets located adjacent to the first pocket in the channel region, wherein the first group of at least two pockets are stacked against one another;

a second group of at least two pockets located adjacent to the second pocket in the channel region, wherein the second group of at least two pockets are stacked against one andother;

49. The semiconductor device of claim 45, wherein the second set of pockets includes at least two pockets stacked against each of the first set of pockets, wherein each of the at least two pockets stacked against each of the first set of pockets has a rank, i, and a length, $Ln_i$, and a concentration, $Nn_i$, of a dopant of the second conductivity type that satisfy the relationship:

$Ln_1>Lp$;

$Ln_{i-1}<Ln_i<Ln_{i+1}$;

$Nn_{i-1}>Nn_i>Nn_{i+1}$; and wherein the sum, $\Sigma Nn_i$, of the concentrations of the dopant in the second set of pockets satisfies the relationship, $\Sigma Nn_i<Ns$.

* * * * *

UNITED STATES PATENT AND TRADEMARK OFFICE

CERTIFICATE OF CORRECTION

PATENT NO. : RE 41,764 E
APPLICATION NO. : 11/318397
DATED : September 28, 2010
INVENTOR(S) : Thomas Skotnicki et al.

It is certified that error appears in the above-identified patent and that said Letters Patent is hereby corrected as shown below:

Column 10

Lines 33, please delete "one andother;" and substitute -- one another. --.

Signed and Sealed this

Seventh Day of December, 2010

David J. Kappos

David J. Kappos
*Director of the United States Patent and Trademark Office*